(12) United States Patent
Yang et al.

(10) Patent No.: US 9,280,186 B2
(45) Date of Patent: Mar. 8, 2016

(54) MODULARIZED SERVER

(75) Inventors: Fu-Jen Yang, New Taipei (TW); Chung-Ta Lin, New Taipei (TW)

(73) Assignee: Wistron Corp., New Taipei (TW)

( * ) Notice: Subject to any disclaimer, the term of this patent is extended or adjusted under 35 U.S.C. 154(b) by 49 days.

(21) Appl. No.: 13/591,165

(22) Filed: Aug. 21, 2012

(65) Prior Publication Data

US 2013/0141851 A1  Jun. 6, 2013

(30) Foreign Application Priority Data

Dec. 6, 2011  (TW) .............................. 100144784 A (51) Int. Cl.
*H05K 7/14* (2006.01)
*G06F 1/18* (2006.01)

(52) U.S. Cl.
CPC .............. *G06F 1/183* (2013.01); *H05K 7/1487* (2013.01)

(58) Field of Classification Search
CPC ......... G06F 1/181; G06F 1/183; G06F 1/184; G06F 1/186; G06F 1/187; G06F 1/188; G06F 1/1616; G06F 1/1656; G06F 1/1679; G11B 33/124; G11B 33/128; G11B 33/08; G11B 33/022; G11B 25/043; G07F 17/3216; A47B 88/047; A47B 88/10; A47B 88/16; A47B 2210/0059; E05B 65/46; H05K 7/1487; H05K 7/1488; H05K 7/1489; H05K 7/1401; H05K 7/1411; H05K 7/1418; H05K 7/1431; H05K 7/1454; H05K 7/1455; H05K 7/1474; H05K 7/14
USPC .......... 361/724–727, 679.33–679.39, 679.43, 361/679.58; 312/223.1, 223.2, 333
See application file for complete search history.

(56) References Cited

U.S. PATENT DOCUMENTS

| 5,278,730 | A  | * | 1/1994  | Kikinis ..................... 361/679.32 |
| 7,227,751 | B2 | * | 6/2007  | Robbins et al. ............... 361/695 |
| 7,499,286 | B2 | * | 3/2009  | Berke et al. ................... 361/756 |
| 7,864,519 | B2 | * | 1/2011  | Lin et al. ................... 361/679.33 |
| 8,184,442 | B2 | * | 5/2012  | Fujimura et al. ............... 361/756 |
| 8,235,477 | B2 | * | 8/2012  | Cunha ........................... 312/333 |
| 8,289,696 | B2 | * | 10/2012 | Peng et al. ............... 361/679.39 |
| 2002/0089823 | A1 | * | 7/2002 | Chin ............................. 361/687 |
| 2003/0030977 | A1 | * | 2/2003 | Garnett et al. ................. 361/687 |
| 2003/0112596 | A1 | * | 6/2003 | Shih ............................. 361/685 |
| 2009/0009954 | A1 | * | 1/2009 | Bushby et al. ................. 361/685 |

(Continued)

FOREIGN PATENT DOCUMENTS

| TW | I296496   | 5/2008 |
| TW | M362589 U1 | 8/2009 |

OTHER PUBLICATIONS

Taiwan Patent Office, Office Action, Patent Application Serial No. 100144784, Oct. 23, 2013, Taiwan.

(Continued)

*Primary Examiner* — Hoa C Nguyen
*Assistant Examiner* — Christopher L Augustin (57) ABSTRACT

A modularized server includes a main housing, a first block unit, a second block unit, and a removable module. The main housing has a first inserting groove and a second inserting groove, and the removable module has a guide channel. When the removable module is disposed in the first inserting groove along a sliding direction, the first block unit is located in the guide channel. Moreover, the second block unit blocks the removable module from being installed to the second inserting groove.

8 Claims, 7 Drawing Sheets

(56) References Cited

U.S. PATENT DOCUMENTS

2009/0109609 A1\* 4/2009 Lai et al. .................. 361/679.39
2012/0236488 A1\* 9/2012 Wallace et al. .......... 361/679.31
2014/0240915 A1\* 8/2014 Phelan et al. ............ 361/679.31

OTHER PUBLICATIONS

China Patent Office, Office Action, Patent Application Serial No. 201110441779.7, Jun. 18, 2015, China.

\* cited by examiner

MODULARIZED SERVER

CROSS-REFERENCE TO RELATED APPLICATIONS

This Application claims priority of Taiwan Patent Application No. 100144784, filed on Dec. 6, 2011, the entirety of which is incorporated by reference herein.

BACKGROUND OF THE INVENTION

1. Field of the Invention

The invention relates to servers, in particular to modularized servers.

2. Description of the Related Art

In general, many kinds of network functions, such as domain control and Ethernet switch, can be provided by one server, and the server is modularized for installing different removable modules for different network environments.

For decreasing manufacturing costs of the modularized server, the structures of housings of the different removable modules are the same, and the different removable modules may be inserted in the same inserting groove of the modularized servers. However, the different removable modules may have different connecting interfaces to connect to the modularized server. If a user installs the removable module into a wrong inserting groove of the modularized server, the removable module cannot connect with the modularized server correctly, and further the connecting interface may be damaged during the installing process.

To prevent the modularized server from wrong operation, every kind of removable modules should have different housings and the modularized server should have different corresponding inserting grooves. However, this will increase the manufacturing cost of both the removable modules and the modularized server.

BRIEF SUMMARY OF THE INVENTION

To solve the problems of the prior art, the objective of the invention provides a modularized server including removable modules and block elements. The structures of the housings of the removable modules are the same, and the block elements prevent the removable modules from being wrongly installed.

For the above objective, a modularized server includes a main housing, a first block unit, a second block unit, a first removable module, and a second removable module. The main housing has a first inserting groove and a second inserting groove. The first block unit is disposed in the first inserting groove. The second block unit is disposed in the second inserting groove. The first removable module includes a first housing having a first guide channel extending along a sliding direction. The second removable module includes a second housing having a second guide channel along the sliding direction. The structure of the first housing rotated at 180 degrees is the same as the structure of the second housing.

When the first removable module is disposed in the first inserting groove along the sliding direction, the first block unit is located in the first guide channel and moved in relation to the first guide channel. When second removable module is disposed in the second inserting groove along the sliding direction, the second block unit is located in the second guide channel and moved in relation to the second guide channel. Moreover, the second block unit blocks the first removable module from being inserted into the second inserting groove, and the first block unit blocks the second removable module from being inserted into the first inserting groove.

In conclusion, since the structures of the housings of the removable modules are the same, the manufacturing cost is decreased. Moreover, by the guide channel of the housing and the block unit of the main housing, the removable modules are prevented from being wrongly installed.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
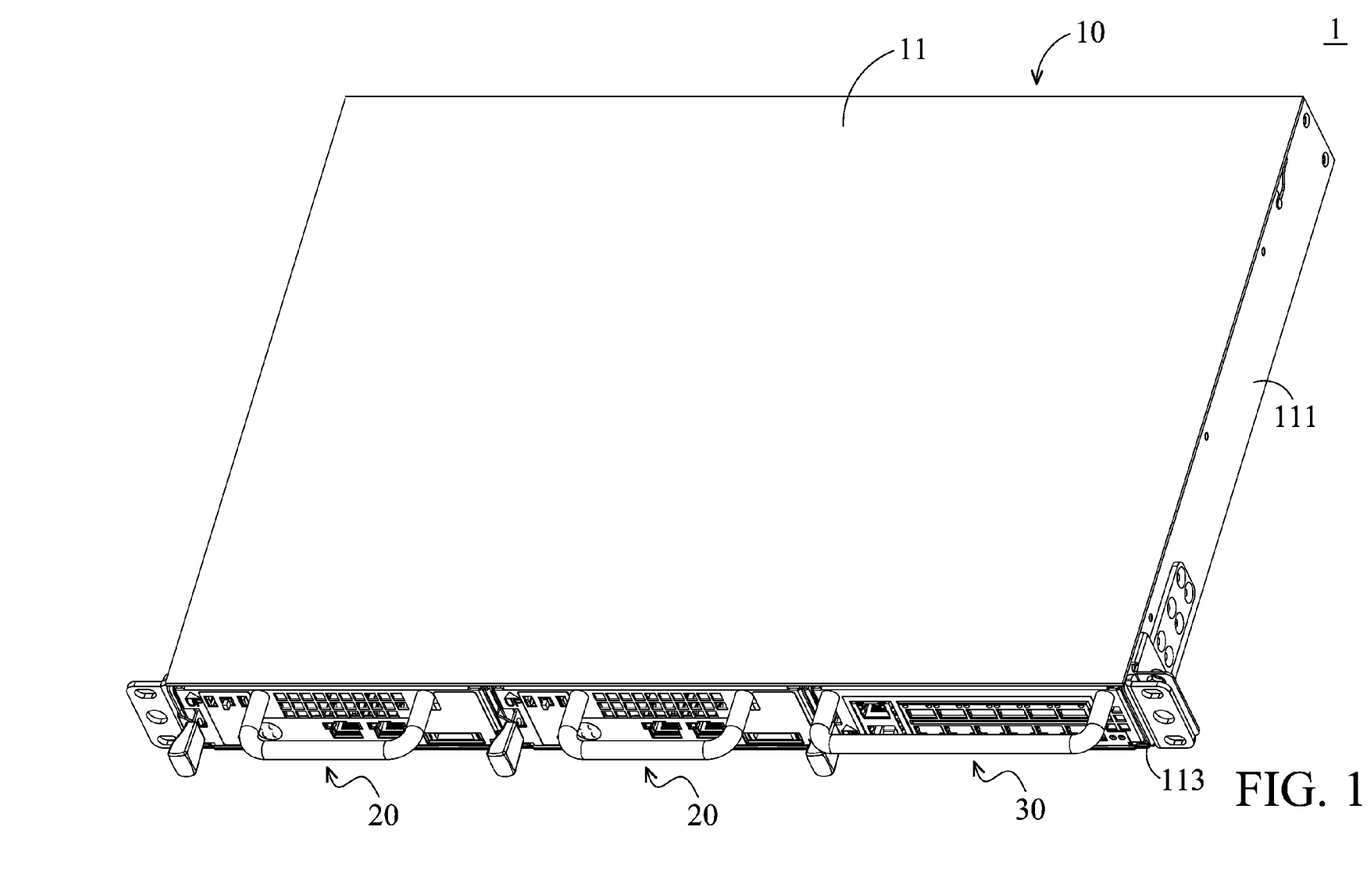
FIG. 1 is a perspective view of a modularized server of the invention.

FIG. 1 is a perspective view of the modularized server 1 of the invention. The modularized server 1 may be a network modularized server. As shown in FIG. 1, the modularized server 1 includes a server body 10, two first removable modules 20, and a second removable module 30. The first removable modules 20 and the second removable module 30 may be network modules, such as domain control modules or Ethernet switch modules, and the first removable modules 20 are different from the second removable module 30. The first removable modules 20 and the second removable module 30 are removably disposed on the server body 10.

Figure 2:
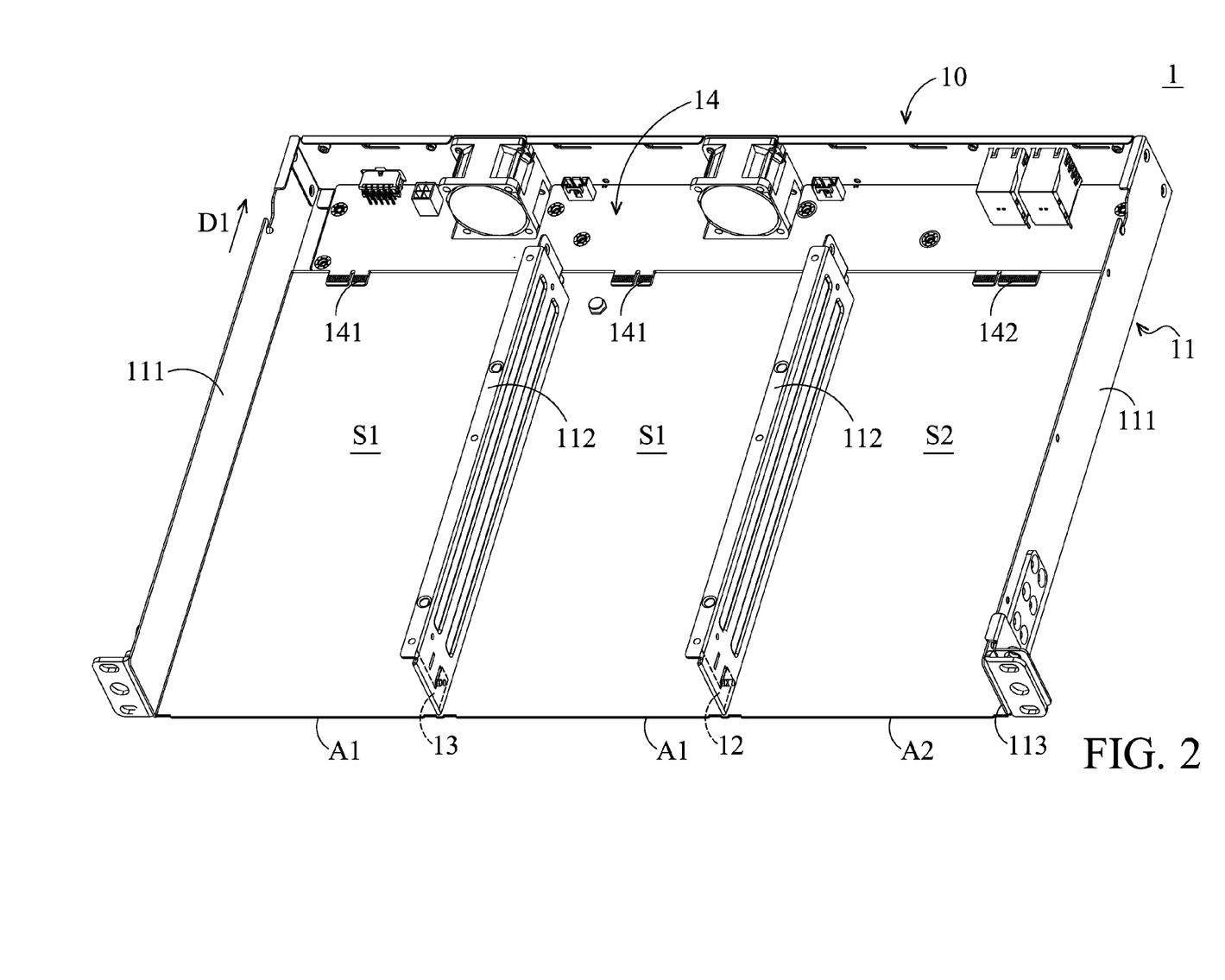
FIG. 2 is a perspective view of a server body of the invention.

FIG. 2 is a perspective view of the server body 10 of the invention. As shown in FIG. 2, the server body 10 includes a main housing 11, a first block element 12, a second block element 13, and a connecting interface 14.

The main housing 11 includes two side walls 111, two partition plates 112, two first inserting grooves S1, a second inserting groove S2, and a front wall 113. The side walls 111 are located at two opposite sides of the main housing 11. The side walls 111 and the partition plates 112 are respectively extended along a sliding direction D1. The partition plates 112 are located in the main housing 11 and between the side walls 111 to form the first inserting groove S1 and the second inserting groove S2 within the main housing 11. The front wall 113 is connected with the side walls 111, and has two first openings A1 and a second opening A2. The first openings A1 are respectively communicated with the first inserting grooves S1, and the second opening A2 is communicated with the second inserting groove S2.

The first block element 12 and the second block element 13 are disposed on the two partition plates 112, respectively. The connecting interface 14 is disposed in the main housing 11. The connecting interface 14 includes two first connecting portions 141 and a second connecting portion 142. The first connecting portions 141 and the second connecting portion 142 are electronic connectors, and the first connecting portions 141 are different from the second connecting portion 142. The first connecting portions 141 are respectively located in the first inserting grooves S1, and the second connecting portion 142 is located in the second inserting groove S2. The location of the first connecting portion 141 in the first inserting groove S1 may different from the location of the second connecting portion 142 in the second inserting groove S2.

Figure 3:
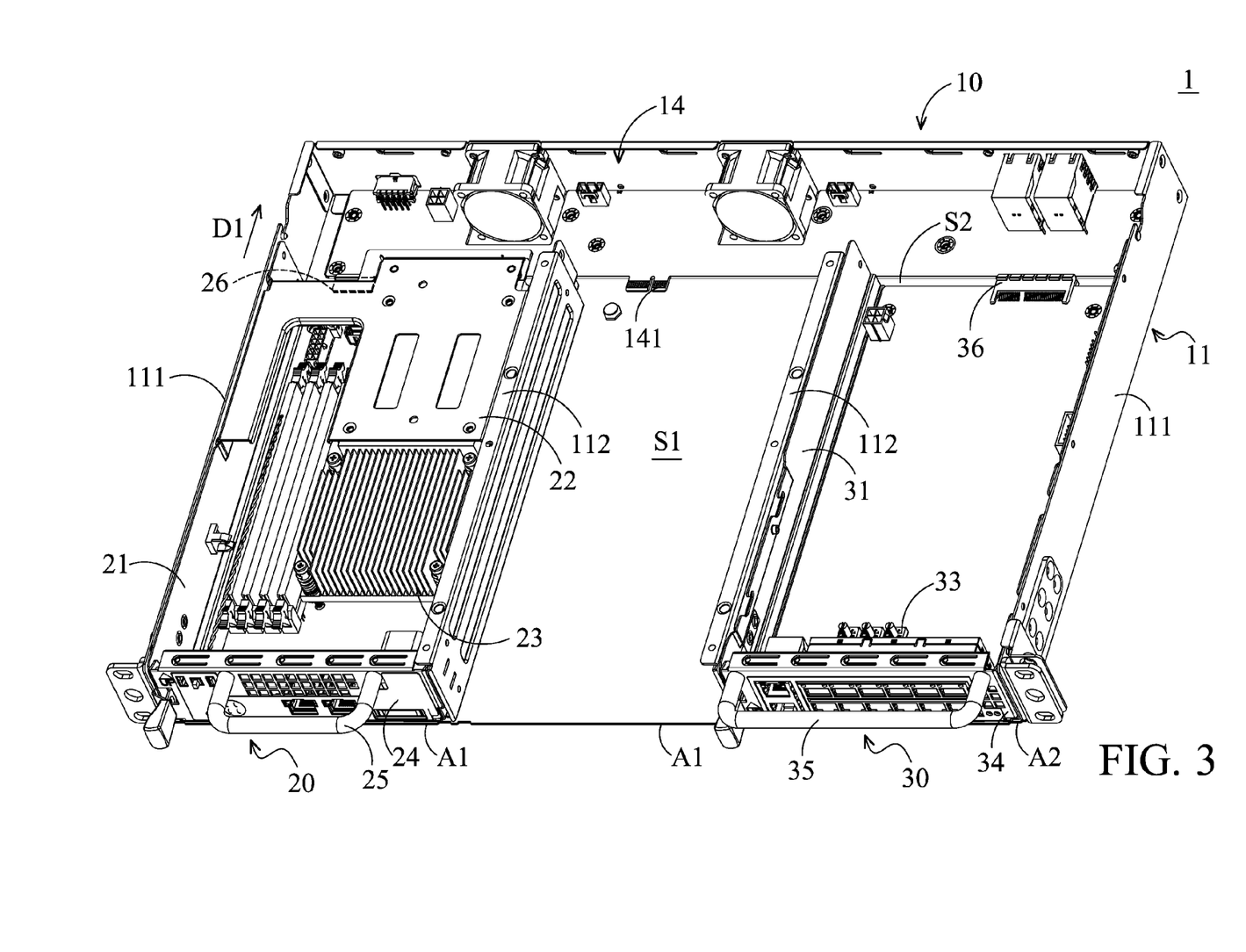
FIG. 3 is a partial perspective view of the modularized server of the invention.

FIG. 3 is a partial perspective view of the modularized server 1 of the invention, wherein only one first removable module 20 is shown. As shown in FIGS. 2 and 3, the first removable module 20 is disposed in the first inserting groove S1, and the second removable module 30 is disposed in the second inserting groove S2.

The first removable module 20 includes a first housing 21, a cover 22, a plurality of the electronic elements 23, a panel 24, a handle 25, and a first connector 26. The cover 22 is disposed on the first housing 21. For example, a 2.5" hard disk and a hard disk switching element (not shown in figures) may be installed on the cover 22. The electronic elements 23 may be hard disks, hard disk switching elements, CPUs, memories, or electronic connectors, and are disposed in the first housing 21. The panel 24 is disposed on the first housing 21, and the handle 25 is disposed on the panel 24. Thus, a user may pull out the first removable module 20 from the main housing 11 by the handle 25.

The first connector 26 is coupled to the electronic element 23. When the first removable module 20 is disposed in the first inserting groove S1 via the first opening A1, the first connector 26 is connected with the first connecting portion 141 (as shown in FIG. 2), and the panel 24 covers the first opening A1.

The second removable module 30 includes a second housing 31, a plurality of electronic elements 33, a panel 34, a handle 35, and a second connector 36. The electronic elements 33 are disposed in the second housing 31. The panel 34 is disposed on the second housing 31, and the handle 35 is disposed on the panel 34. Thus, a user may pull out the second removable module 30 from the main housing 11 via the handle 35.

The second connector 36 is coupled to the electronic element 33. When the second removable module 30 is disposed in the second inserting groove S2 via the second opening A2, the second connector 36 is connected with the second connecting portion 142 (as shown in FIG. 2), and the panel 34 covers the second opening A2.

Figure 4:
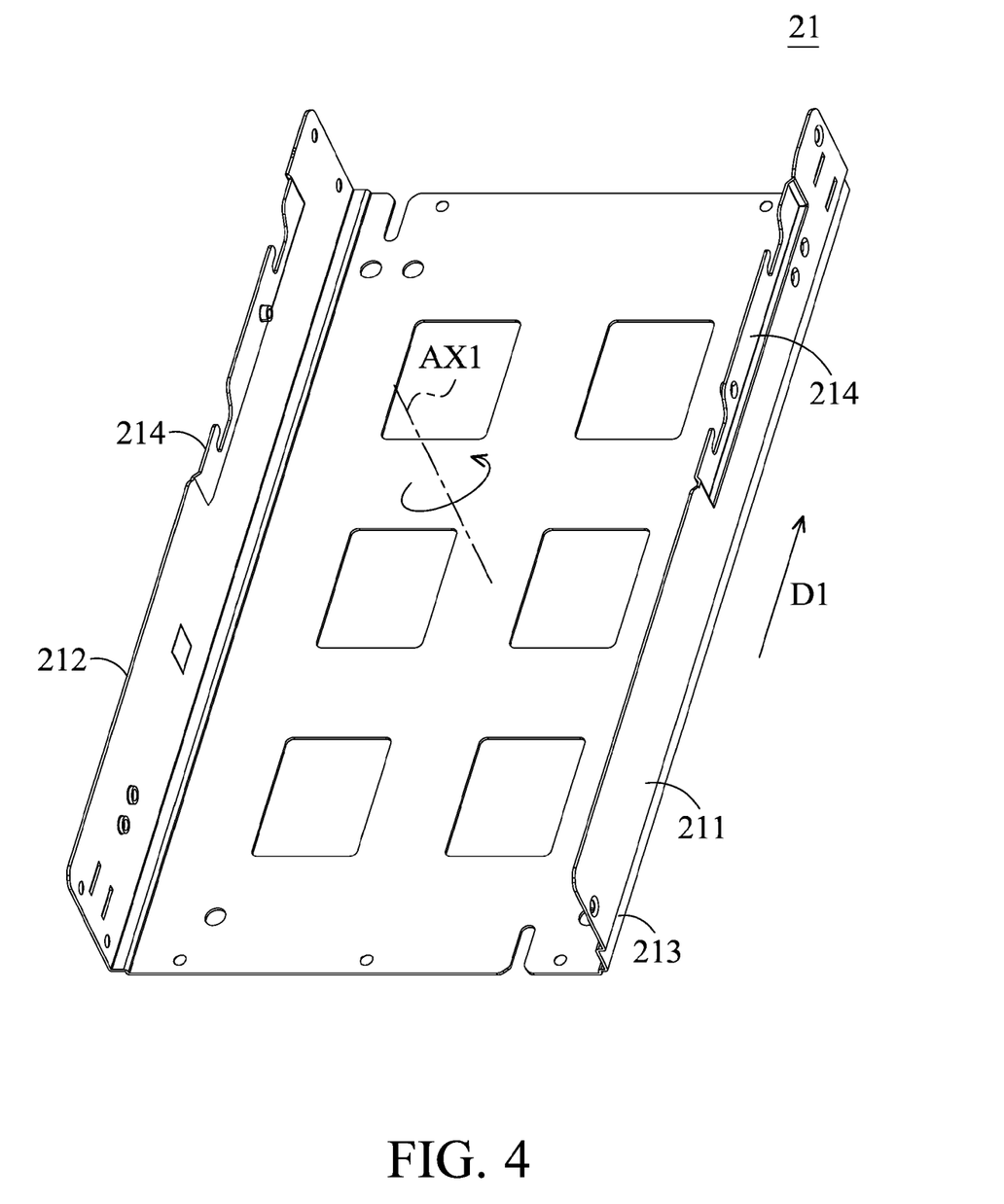
FIG. 4 is a perspective view of a first housing of the invention.
Figure 5:
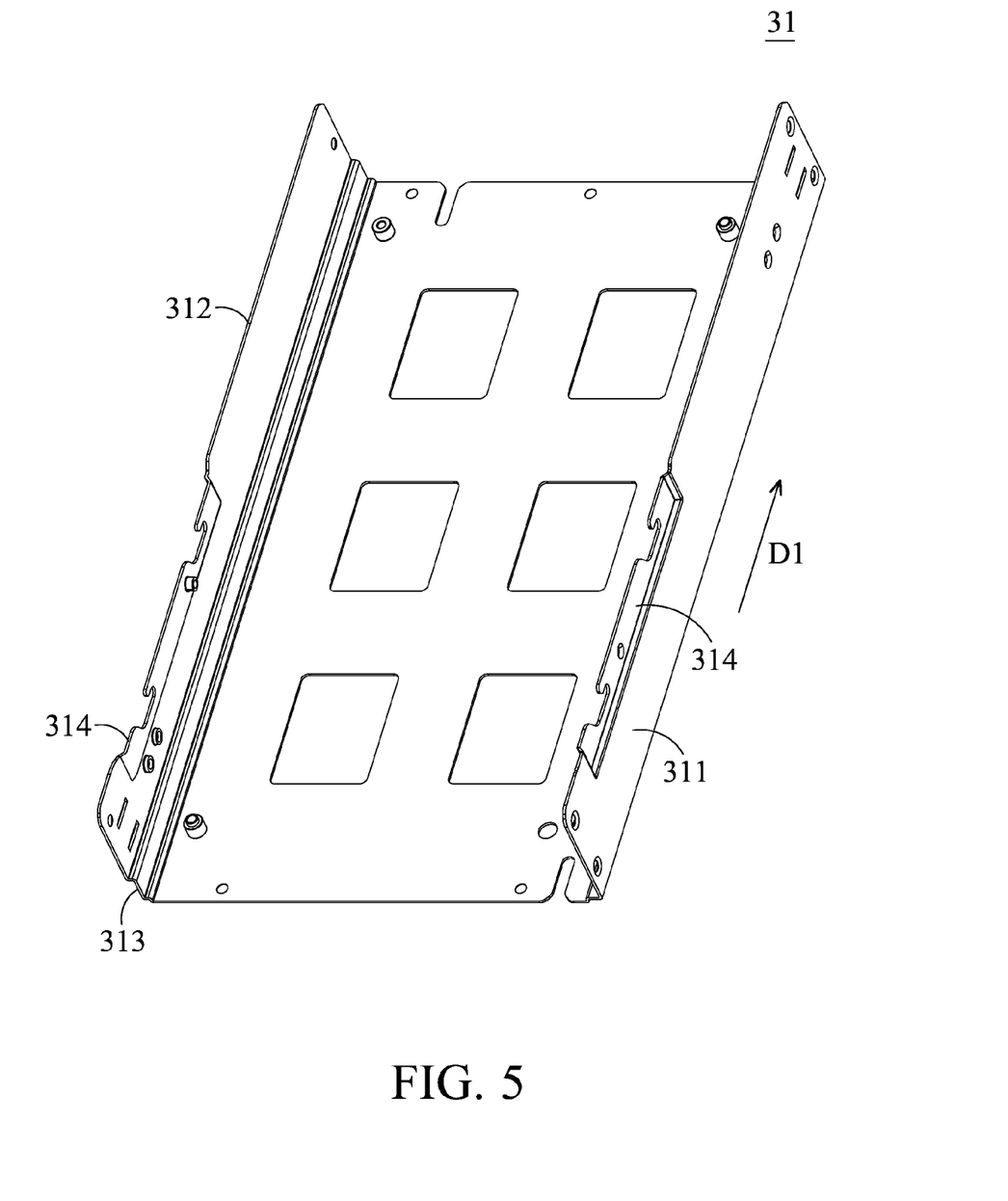
FIG. 5 is a perspective view of a second housing of the invention.

FIG. 4 is a perspective view of the first housing 21 of the invention, and FIG. 5 is a perspective view of the second housing 31 of the invention. As shown in FIGS. 4 and 5, the first housing 21 has two lateral surfaces 211 and 212, a first guide channel 213, and two first retaining grooves 214. The lateral surfaces 211 and 212 are located on two opposite sides of the first housing 21. The first guide channel 213 is disposed on the lateral surface 211, and extended along the sliding direction D1. The first retaining grooves 214 are disposed respectively on the lateral surface 211 and 212, and the cover 22 (as shown in FIG. 3) is disposed on the first retaining grooves 214.

The second housing 31 has two lateral surfaces 311 and 312, a second guide channel 313, and two second retaining grooves 314. The lateral surfaces 311 and 312 are located on two opposite sides of the second housing 31. The second guide channel 313 is disposed on the lateral surface 312, and extended along the sliding direction D1. The second retaining grooves 314 are disposed respectively on the lateral surface 311 and 312. In the embodiment, another cover may be disposed on the second retaining grooves 314.

As shown in FIGS. 4 and 5, the first housing 21 defines a central axis AX1, and the structure of first housing 21 rotated at 180 degrees is the same as the structure of the second housing 31. Thus, the first housing 21 and the second housing 31 could be made by the same mold to decrease the manufacturing costs.

Figure 6:
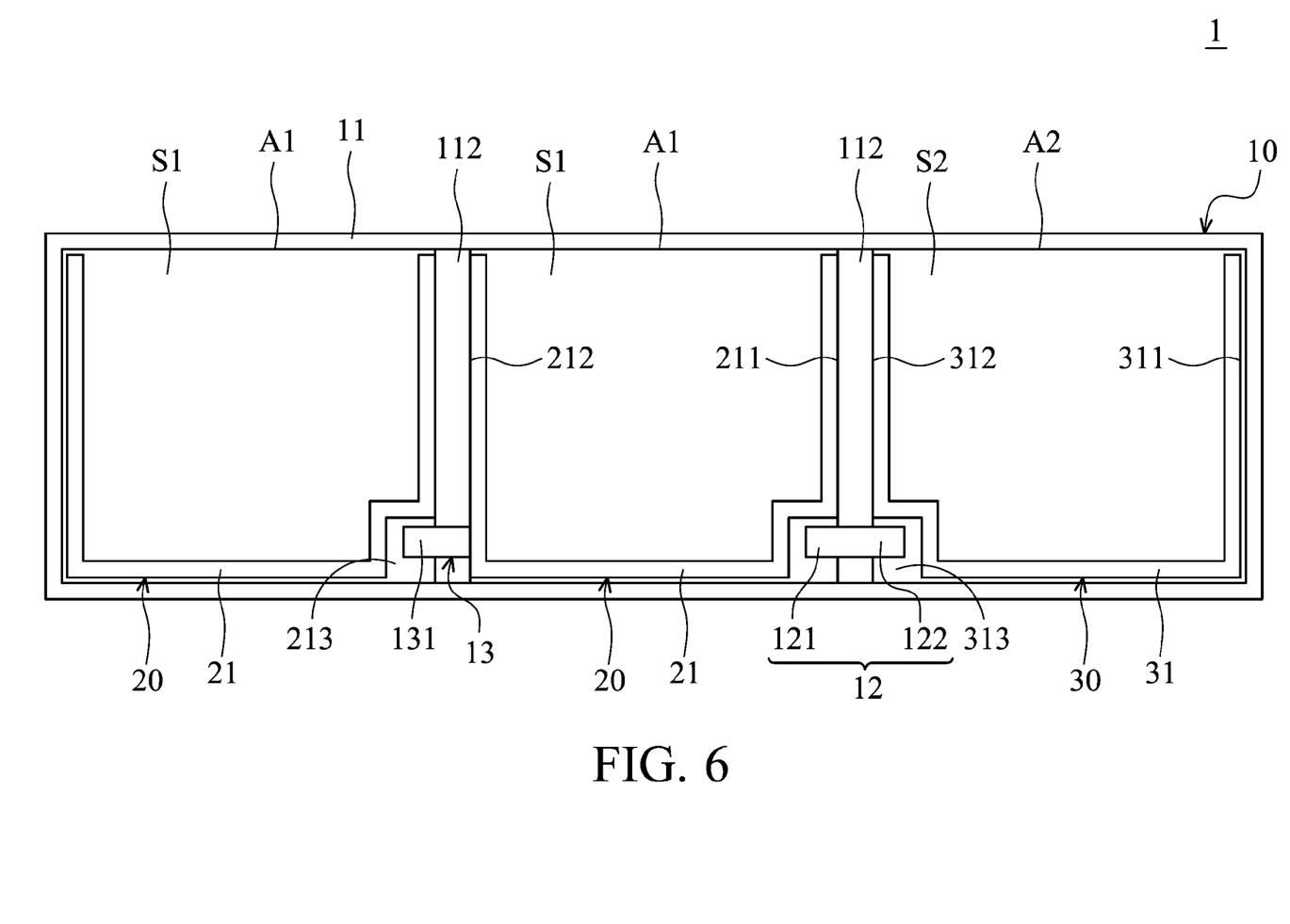
FIGS. 6 and 7 are schematic views of the modularized server of the invention.

FIG. 6 is a schematic view of the modularized server 1 of the invention. As shown in FIGS. 3 to 6, the first block element 12 is located between the first inserting groove S1 and the second inserting groove S2. The first block element 12 includes a first block unit 121 and a second block unit 122. The first block unit 121 and the second block unit 122 are disposed on two opposite sides of the partition plate 112. The first block unit 121 is located in the first inserting groove S1, and the second block unit 122 is located in the second inserting groove S2.

In one embodiment, the first block unit 121 and the second block element 122 are disposed on two opposite sides of the partition plate 112 by riveting. In another embodiment, the first block unit 121 and the second block element 122 have screw threads and are integrally formed as a single piece. The first block unit 121 and the second block element 122 penetrate through the partition plate 112, and are fixed on the partition plate 112 by screwing.

The second block element 13 is located between the two first inserting grooves S1. The second block element 13 includes a first block unit 131 disposed on a side of the partition plate 112 and located on one of the first inserting grooves S1. In one embodiment, the first block unit 131 is disposed on a side of the partition plate 112 by riveting. In another embodiment, the first block unit 131 has a screw thread and is fixed on a side of the partition plate 112 by screwing. By the first block element 12 and the second block element 13, the structures of the partition plates 112 may be the same, and thus the manufacturing costs are decreased.

When the first removable module 20 is disposed in the first inserting groove S1 along the sliding direction D1, the first block unit 121 is moved in relation to the first guide channel 213 to allow the first connector 26 to connect with the first connecting portion 141 (as shown in FIGS. 2 and 3). When the second removable module 30 is disposed in the second inserting groove S2 along the sliding direction D1, the second block unit 122 is moved in relation to the second guide channel 313 to allow the second connector 36 to connect with the second connecting portion 142 (as shown in FIGS. 2 and 3). Thus, the first removable module 20 and the second removable module 30 are installed in the first inserting groove S1 and the second inserting groove S2 easily.

Figure 7:
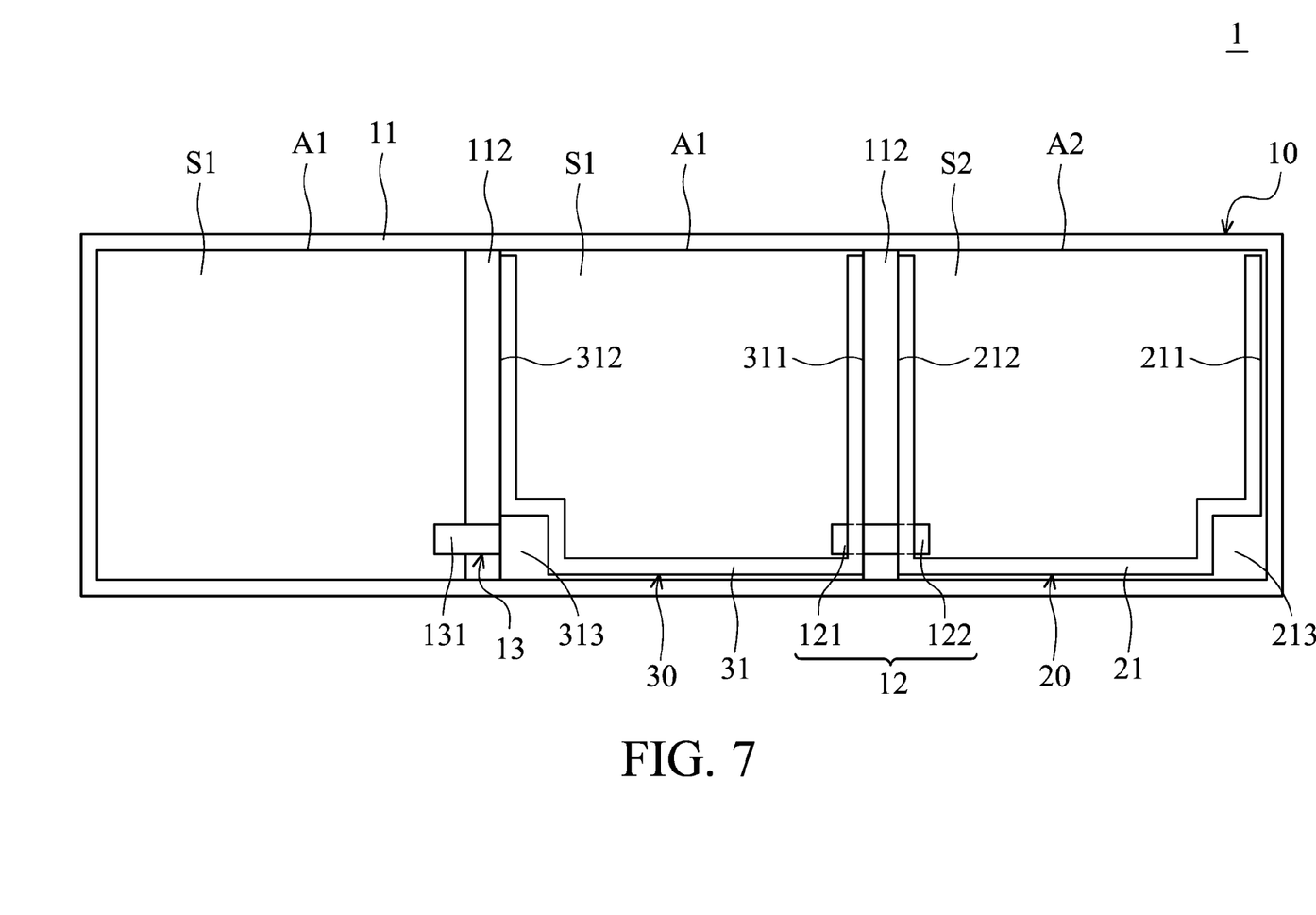

As shown in FIG. 7, when the user installs the first removable module 20 into the second inserting groove S2, the second block unit 122 blocks the lateral surface 212 of the first housing 21 from being inserted into the second inserting groove S2. Since the first removable module 20 cannot be installed in the second inserting groove S2, wrong operation made by the user can be prevented. Further, the first connector 26 is prevented from connecting to the second connecting portion 142, or prevented from damage by colliding with the second connecting portion 142.

Equally, when the user installs the second removable module 30 into the first inserting groove S1, the first block unit 121 blocks the lateral surface 311 of the second housing 31 from being inserted into the first inserting groove S1. Since the second removable module 30 cannot be installed in the first inserting groove S1, wrong operation made by the user can be prevented. Further, the second connector 36 is prevented from being connected to the first connecting portion 141, or prevented from damage by colliding with the first connecting portion 141.

In conclusion, since the structures of the housings of the removable modules are the same, the manufacturing costs are decreased. Moreover, by the guide channel of the housing and the block unit of the main housing, the removable modules are prevented from being wrongly installed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A modularized server, comprising:
    a main housing having a first inserting groove, a second inserting groove, and a partition plate disposed therein to form the first inserting groove and the second inserting groove, wherein each of the first inserting groove and the second inserting groove has a first side and a second side opposite to the first side, and a relative orientation between the first side of the first inserting groove and the second side of the first inserting groove is the same as a relative orientation between the first side of the second inserting groove and the second side of the second inserting groove;
    a block element formed as a single piece passing through the partition plate, wherein the block elements comprises a first block unit at one end thereof, and a second block unit at another end thereof, arranged such that the first block unit is disposed at the first side of the first inserting groove and protrudes toward the second side of the first inserting groove and the second block unit is disposed at the second side of the second inserting groove, and protrudes toward the first side of the second inserting groove, such that the first block unit and the second block unit are directly disposed on two opposite sides of the partition plate and located at a plane;
    a first removable module comprising a first housing having a first lateral surface, a second lateral surface and a first guide channel extending along a sliding direction and disposed at the first lateral surface, wherein the first lateral surface and the second lateral surface are located at two opposite sides of the first housing; and
    a second removable module comprising a second housing having a second guide channel extending along the sliding direction, wherein the first housing and the second housing have the same structure,
    wherein the first housing has a first end and a second end opposite to the first end;
    arranged such that when the first end of the first housing faces the first inserting groove, and the first lateral surface of the first housing corresponds to the first side of the first inserting groove, the first housing is insertable into the first inserting groove and the first block unit is movable in the first guide channel along the sliding direction,
    when the first housing is inserted in the first inserting groove along the sliding direction, the first lateral surface of the first housing faces the first side of the first inserting groove, and the second removable module is disposed in the second inserting groove along the sliding direction, the first block unit is located in the first guide channel and moved in relation to the first guide channel, and when the and the second block unit is located in the second guide channel and moved in relation to the second guide channel,
    when the first end of the first housing faces the second inserting groove, and the second lateral surface of the first housing corresponds to the second side of the second inserting groove, the second block unit blocks the second lateral surface from being inserted into the second inserting groove,
    when the second end of the first housing faces the first inserting groove, and the second lateral surface of the first housing corresponds to the first side of the first inserting groove, the first block unit blocks the second lateral surface from being inserted into the first inserting groove, and
    when the second end of the first housing faces the second inserting groove and the first lateral surface of the first housing corresponds to the second side of the second inserting groove, the first housing is insertable into the second inserting groove, and the second block unit is movable in the first guide channel along the sliding direction.

2. The modularized server as claimed in claim 1, wherein the second housing having a third lateral surface, a fourth lateral surface, the second guide channel disposed at the fourth lateral surface, wherein the third lateral surface and the fourth lateral surface are located at two opposite sides of the second housing,
    wherein the second housing has a first end and a second end opposite to the first end;
    arranged such that when the first end of the second housing faces the second inserting groove, and the fourth lateral surface of the second housing corresponds to the second side of the second inserting groove, the second housing is insertable into the second inserting groove and the second block unit is movable in the second guide channel along the sliding direction,
    when second housing is inserted in the second inserting groove along the sliding direction, and the fourth lateral surface of the second housing faces the second side of the second inserting groove, the second block unit is located in the second guide channel and moved in relation to the second guide channel,
    when the first end of the second housing faces the first inserting groove, and the third lateral surface of the second housing corresponds to the first side of the first inserting groove, the first block unit blocks the third lateral surface from being inserted into the first inserting groove,
    when the second end of the second housing faces the second inserting groove, and the third lateral surface of the second housing corresponds to the second side of the second inserting groove, the second block unit blocks the third lateral surface from being inserted into the second inserting groove, and
    when the second end of the second housing faces the first inserting groove and the fourth lateral surface of the second housing corresponds to the first side of the first inserting groove, the second housing is insertable into the first inserting groove, and the first block unit is movable in the second guide channel along the sliding direction.

3. The modularized server as claimed in claim 2, wherein the first housing is inserted in the first inserting groove along the sliding direction by the first end of the first housing facing the first inserting groove, and the second housing is inserted in the second inserting groove along the sliding direction by the first end of the second housing facing the second inserting groove.

4. The modularized server as claimed in claim 2, wherein the first removable module and the second removable module are network modules.

5. The modularized server as claimed in claim 2, wherein the first removable module comprises an electronic element disposed at the first housing, and the second removable module comprises an electronic element disposed at the second housing, wherein the electronic elements are hard disks, hard disk switching elements, CPUs, memories, or electronic connectors.

6. The modularized server as claimed in claim 2, further comprising a connecting interface, disposed in the main housing, comprising a first connecting portion located in the first inserting groove, and a second connecting portion located in the second inserting groove, wherein the first connecting portion is different from the second connecting portion.

7. The modularized server as claimed in claim 6, wherein the first removable module comprises a first connector, the second removable module comprises a second connector, and the first connector is different from the second connector, wherein when first removable module is disposed in the first inserting groove, the first connector is connected to the first connecting portion, and when the second removable module is disposed in the second inserting groove, the second connector is connected to the second connecting portion.

8. A modularized server, comprising:
- a main housing having a first inserting groove, a second inserting groove, and a partition plate disposed therein to form the first inserting groove and the second inserting groove;
- a block element formed as a single piece passing through the partition plate, wherein the block elements comprises a first block unit at one end thereof, and a second block unit at another end thereof, arranged such that the first block unit is disposed in the first inserting groove, the second block unit is disposed in the second inserting groove, such that the first block unit and the second block unit are directly disposed on two opposite sides the partition plate;
- a first removable module comprising a first housing having a first guide channel extending along a sliding direction; and
- a second removable module comprising a second housing having a second guide channel extending along the sliding direction, wherein the first housing and the second housing have the same structure;
- arranged such that when the first removable module is disposed in the first inserting groove along the sliding direction and the second removable module is disposed in the second inserting groove along the sliding direction, the first block unit is located in the first guide channel and moved in relation to the first guide channel, and the second block unit is located in the second guide channel and moved in relation to the second guide channel,
- wherein the second block unit blocks the first removable module from being inserted into the second inserting groove, and the first block unit blocks the second removable module from being inserted into the first inserting groove, and
- arranged such that when the first housing is located in the first inserting groove and the second housing is located in the second inserting groove, the first block unit, the second block unit and the first and the second guide channels are located in a plane, and the first housing and the first guide channel extends along the plane.

* * * * *